United States Patent
Suh et al.

(10) Patent No.: US 7,824,953 B2
(45) Date of Patent: Nov. 2, 2010

(54) METHOD OF OPERATING AND STRUCTURE OF PHASE CHANGE RANDOM ACCESS MEMORY (PRAM)

(75) Inventors: Dong-seok Suh, Seoul (KR); Yoon-ho Khang, Yongin-si (KR); Sang-mock Lee, Yongin-si (KR); Jin-seo Noh, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1093 days.

(21) Appl. No.: 11/329,171

(22) Filed: Jan. 11, 2006

(65) Prior Publication Data
US 2006/0152186 A1    Jul. 13, 2006

(30) Foreign Application Priority Data
Jan. 12, 2005    (KR) .................... 10-2005-0002889

(51) Int. Cl.
*H01L 29/02* (2006.01)
(52) U.S. Cl. .............. 438/102; 257/2; 257/3; 257/4; 257/5; 257/E29.002; 365/163
(58) Field of Classification Search .......... 254/2–5, 254/254, 256, 260, E29.002; 438/167, 800, 438/102–103; 365/163
See application file for complete search history.

(56) References Cited

U.S. PATENT DOCUMENTS

| | | | |
|---|---|---|---|
| 3,769,559 A * | 10/1973 | Dorler et al. ................ 365/159 |
| 5,323,377 A * | 6/1994 | Chen et al. ................... 369/126 |
| 2003/0209746 A1* | 11/2003 | Horii .......................... 257/295 |
| 2004/0057271 A1* | 3/2004 | Parkinson ..................... 365/99 |
| 2004/0251551 A1* | 12/2004 | Hideki ......................... 257/758 |
| 2005/0185445 A1* | 8/2005 | Osada et al. ................. 365/148 |
| 2006/0131555 A1* | 6/2006 | Liu et al. ......................... 257/3 |
| 2006/0138393 A1* | 6/2006 | Seo et al. ......................... 257/2 |

FOREIGN PATENT DOCUMENTS

CN    1538540    10/2004

OTHER PUBLICATIONS

First Office Action from corresponding Chinese Application No. 2006100057378, issued on Aug. 29, 2008.

* cited by examiner

*Primary Examiner*—Bradley K Smith
*Assistant Examiner*—Jami M Valentine
(74) *Attorney, Agent, or Firm*—Buchanan Ingersoll & Rooney PC

(57) ABSTRACT

Provided is a method of operating a phase change random access memory comprising a switching device and a storage node comprising a phase change layer. The method includes applying a reset current passing through the phase change layer from a lower portion of the phase change layer toward an upper portion of the phase change layer and being smaller than 1.6 mA to the storage node to change a portion of the phase change layer into an amorphous state. The set voltage is in an opposite direction is exemplary embodiments, and a connector is of small cross-sectional area.

9 Claims, 5 Drawing Sheets

(a)

(b)

(a)  (b)

PROGRAMING : +1mA; −1mA
RESISTANCE=V/I (@0.01mA)

METHOD OF OPERATING AND STRUCTURE OF PHASE CHANGE RANDOM ACCESS MEMORY (PRAM)

CROSS-REFERENCE TO RELATED PATENT APPLICATION

Priority is claimed to Korean Patent Application No. 10-2005-0002889, filed on Jan. 12, 2005, in the Korean Intellectual Property Office, the disclosure of which is incorporated herein in its entirety by reference.

BACKGROUND OF THE INVENTION

1. Field of the Invention

The present invention relates to a method of operating a semiconductor memory device, and more particularly, to a method of operating a Phase Random Access Memory (PRAM).

2. Description of the Related Art

PRAMs are nonvolatile memory devices such as flash memories, ferroelectric RAMs (FeRAMs), magnetic RAMs (MRAMs), and the like. A structural difference between PRAMs and other nonvolatile memory devices is in a storage node.

Exemplary PRAMs include a phase change layer whose phase is changed from an amorphous state into a crystal state at a predetermined temperature. A resistance of the phase change layer is high in the amorphous state but low in the crystal state. Such PRAMs write and read bit data using such a resistance characteristic of the phase change layer.

FIG. 1 is a view illustrating a conventional PRAM. Referring to FIG. 1, the conventional PRAM includes a transistor Tr and a storage node 10. The storage node 10 includes a lower electrode 10a, a phase change layer 10c, an upper electrode 10d, and a conductive plug 10b connecting the phase change layer 10c to the lower electrode 10a. The lower electrode 10a of the storage node 10 is connected to the drain of the transistor Tr.

FIG. 2 is a view illustrating a method of operating the conventional PRAM. Referring to FIG. 2, when a phase of the phase change layer 10c is in a crystal state (this state is generally regarded as bit data "0" is written), a first phase change current Irs is applied from the upper electrode 10d through the conductive plug 10b to the lower electrode 10a. The first phase change current Irs is called a reset current. The first phase change current Irs is a pulse current and has a lasting time or duration of about 30 ns and has amperage of about 1.6 mA. Since a width of the conductive plug 10b is considerably narrower than that of the phase change layer 10c, the first phase change current Irs concentrates on an area A1 of the phase change layer 10c contacting the conductive plug 10b. Thus, a temperature of the area A1 abruptly becomes higher than or equal to a phase change temperature. As a result, a phase of the area A1 of the phase change layer 10c is changed from a crystal state into an amorphous state. When the area A1 of the phase change layer 10c is in the amorphous state as described above, bit data "1" is generally regarded as being written to the PRAM.

When the area A1 of the phase change layer 10c is in the amorphous state as shown in the central illustration of FIG. 2, a second phase change current Is is applied to the storage node 10 in a direction along which the first phase change current Irs has been applied. The second phase change current Is is called a set current. The second phase current Is is also a pulse current. A duration of the second phase change current Is is longer than the duration of the first phase change current Irs while the amperage of the second phase change current Is is smaller than that of the first phase change current Irs. For example, the duration of the second phase change current Is is about 180 ns and the amperage of the second phase change current Is is smaller than that of the first phase change current Irs. While the second phase change current Is is applied, the area A1 of the phase change layer 10c is changed from the amorphous state into the crystal state.

As described above, in a case of the conventional PRAM, a state of the phase change layer 10c is determined by the first and second phase change currents Irs and Is applied from the upper electrode 10d through the conductive plug 10b toward the lower electrode 10a. However, the first phase change current Is, i.e., the reset current, applied to the phase change layer 10c to change a state of the area A1 of the phase change layer 10c into the amorphous state is an obstacle to the improvement of the characteristic of the conventional PRAM. For example, it is not difficult to reduce sizes of the storage node 10 and the transistor Tr to reduce a size of the conventional PRAM with the development of a technique for fabricating semiconductors. However, a current that the transistor Tr can accommodate, i.e., amperage allowed to pass through the transistor Tr, is reduced with the reduction in the size of the transistor Tr. When the size of the transistor Tr is reduced, the transistor Tr cannot accommodate the amperage, 1.6 mA, of the first phase change current Irs. Thus, if the first phase change current Irs is not reduced, it is difficult to highly integrate the PRAM.

SUMMARY OF THE INVENTION

The present invention provides an exemplary method of operating a PRAM by which a reset current can be greatly reduced so as to improve high integration.

According to an aspect of the present invention, there is provided a method of operating a phase change random access memory including a storage node including a switching device and a phase change layer, including: applying a reset current passing through the phase change layer from a lower portion of the phase change layer toward an upper portion of the phase change layer and being smaller than 1.6 mA to the storage node to change a portion of the phase change layer into an amorphous state.

The method may further include: applying a set current to the storage node in an opposite direction to a direction along which the reset current is applied.

The reset current may be less than or equal to 1 mA.

The reset and set currents may be direct currents or pulse currents.

The storage node may include an upper electrode formed on the phase change layer, a lower electrode formed under the phase change layer, and a connector connecting the phase change layer to the lower electrode. The connector may be a conductive plug or a nanotube.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
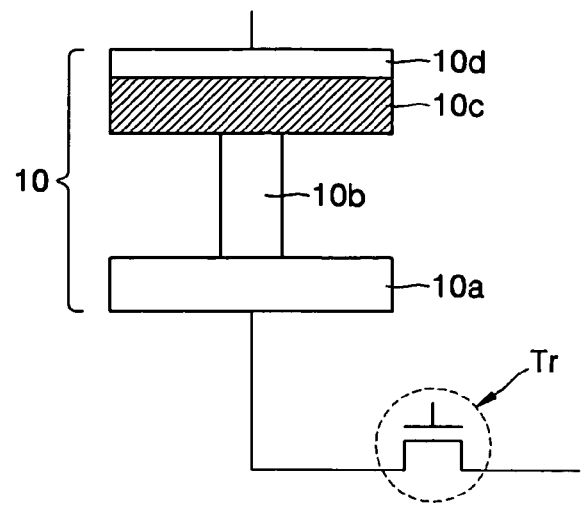
FIG. 1 is a cross-sectional view of a conventional PRAM.
Figure 2:
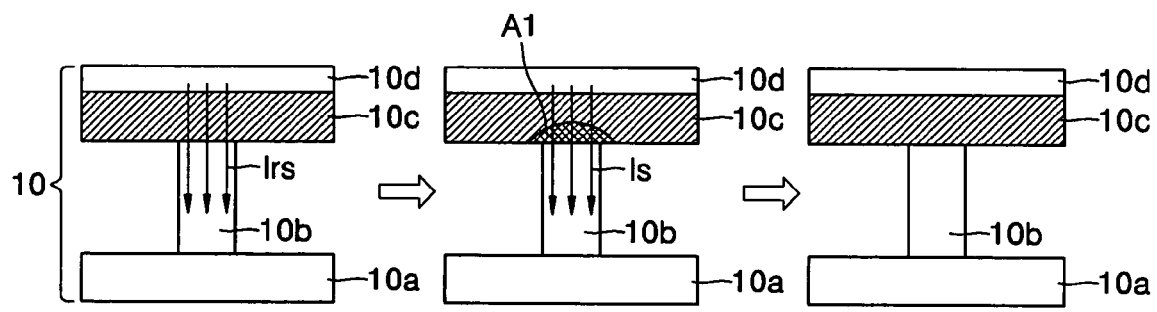
FIG. 2 is a cross-sectional view illustrating a method of operating the PRAM shown in FIG. 1.

The present invention will now be described more fully with reference to the accompanying drawings, in which exemplary embodiments of the invention are shown. In the drawings, the thicknesses of layers and regions are exaggerated for clarity.

A structure of a PRAM used in a method of operating a PRAM according to an embodiment of the present invention will now be described in brief with reference to FIG. 3.

Figure 3:
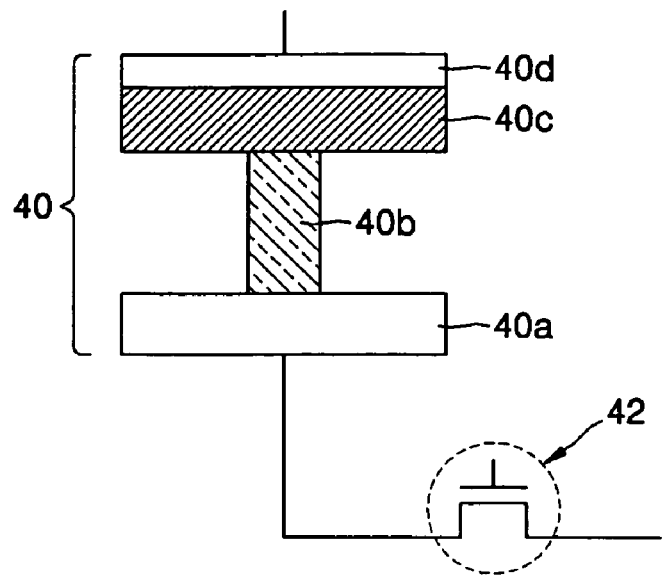
FIG. 3 is a cross-sectional view of a PRAM illustrating a method of operating a PRAM according to an embodiment of the present invention.

Referring to FIG. 3, the PRAM includes a storage node 40 and a switching device 42 connected to the storage node 40. The switching device 42 may be a field effect transistor (FET). Alternatively, the switching device 42 may be another type of switching device, for example, a PN diode, or a bipolar junction transistor (BJT). The storage node 40 includes a lower electrode 40a connected to the switching device 42. The storage node 40 further includes a phase change layer 40c at a predetermined distance from the lower electrode 42a and an upper electrode 40d formed on the phase change layer 40c. The phase change layer 40c is connected to the lower electrode 40a via a connector 40b through which a current can flow. The connector 40b may be a conductive plug formed of a conductive material or a nanotube such as a carbon nanotube or the like.

In the storage node 40 having the above-described structure, the phase change layer 40c may be, for example, a $Ge_2Sb_2Te_5$ layer. The $Ge_2Sb_2Te_5$ layer may be doped with nitrogen. Reset and set currents are proportional to a diameter of the connector 40b. Thus, it is preferable in order to reduce the reset and set currents that the diameter of the connector 40b is small.

A method of operating the PRAM will now be described with reference to FIGS. 4 and 5. For convenience, views shown in FIGS. 4 and 5 illustrate only a storage node to show a changed state of the PRAM after a current is applied to the storage node.

Figure 4:
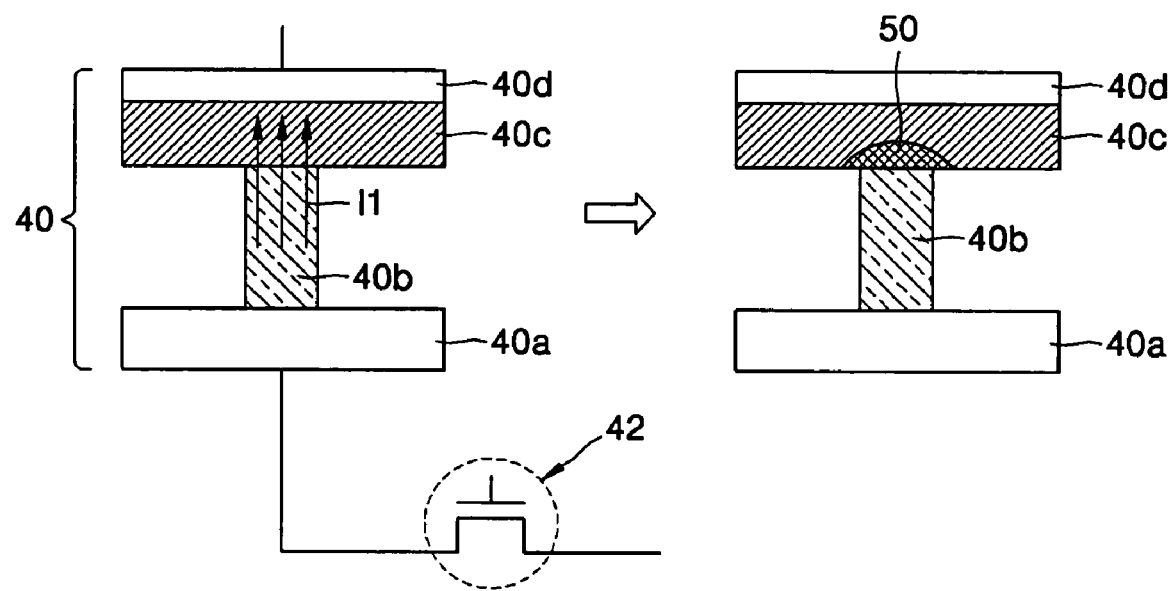
FIG. 4 is a cross-sectional view illustrating a process of forming an amorphous area in a phase change layer by applying a reset current in the method of operating the PRAM according to an embodiment of the present invention.
Figure 5:
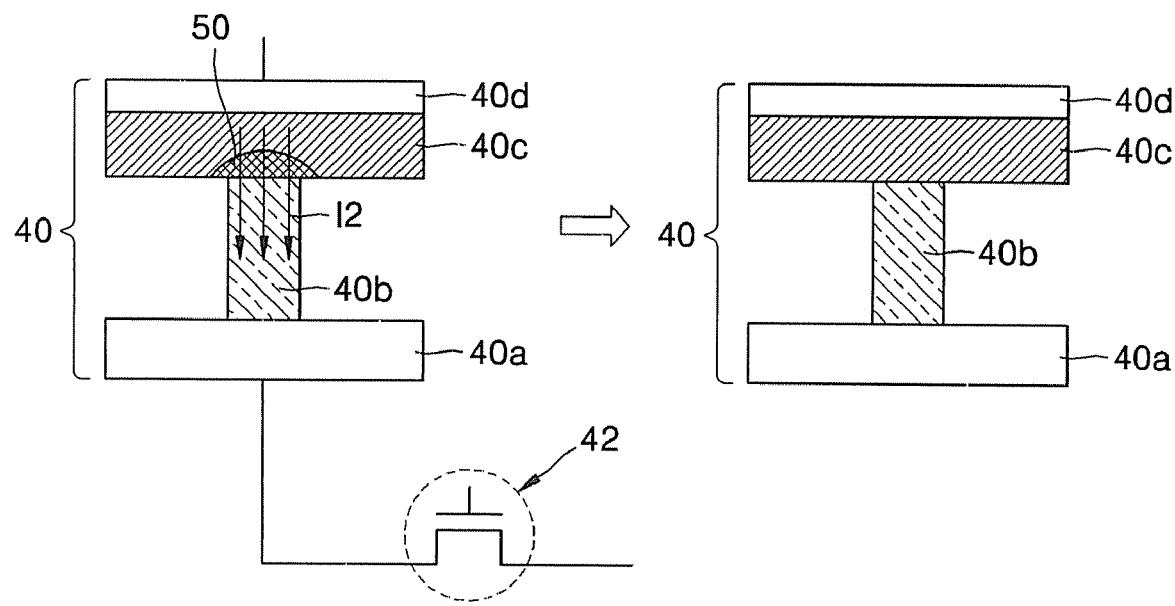
FIG. 5 is a cross-sectional view illustrating a process of changing the amorphous area of the phase change layer into a crystal area by applying a set current in the method of operating the PRAM according to an embodiment of the present invention.

FIG. 4 illustrates a process of writing bit data "1" to the PRAM.

In detail, the switching device 42 is turned on and a first phase change current I1 is applied to the storage node 40 in which an entire portion of the phase change layer 40c is in a crystal state, so as to flow from the lower electrode 40a through the connector 40b and the phase change layer 40c to the upper electrode 40d. The first phase change current I1 may be a reset current and smaller than 1.6 mA. For example, the first phase change current I1 may be less than or equal to 1 mA. The first phase change current I1 may be a direct current (DC) or a pulse current. Temperatures of a portion of the phase change layer 40c contacting the connector 40b and a predetermined area around the phase change layer 40c abruptly become higher than a phase change temperature. As a result, the portion and the predetermined area of the phase change layer 40c are changed into amorphous states. Reference numeral 50 of a view shown on the right side of FIG. 4 denotes an area of the phase change layer 40c whose phase is changed into an amorphous sate due to the first phase change current I1. When the phase change layer 40c includes the amorphous area 50, an electric resistance of the phase change layer 40c is high. In this case, bit data "1" may be regarded as being written to the storage node 40, although this convention does not have to be followed in all instances.

A method of writing an opposite bit data, e.g., "0", will now be described.

Writing of the bit data "0" to the phase change layer 40 following this convention means changing a state of the amorphous area 50 of the phase change layer 40c into a crystal state. In other words, an entire portion of the phase change layer 40c is changed into a crystal state.

In detail, as shown in FIG. 5, the switching device 42 is turned on and a second phase change current I2 is applied to the storage node 40 in which the amorphous area 50 is formed in the phase change layer 40c, so as to flow from the upper electrode 40d through the phase change layer 40c and the connector 40b to the lower electrode 40a.

The second phase change current I2 may be a set current and may be a DC or pulse current. Hence, at least one of the set current and the reset current may be either DC or pulse, including mixtures of one being a pulse current and the other being DC. The second phase change current I2 may be applied in the form of pulse for a longer period of time than a period of time for which the first phase change current I1 is applied. Amperage of the second phase change current I2 may be smaller than 1.6 mA. The amorphous area 50 of the phase change layer 40c is changed into the crystal state while the second phase change current I2 is applied for the long period of time. Thus, the entire portion of the phase change layer 40c is changed into the crystal state as shown in a right view of FIG. 5. When the phase change layer 40c does not include an amorphous area, an electric resistance of the phase change layer 40c is much lower than when the phase change layer 40c includes the amorphous area 50 as shown in FIG. 4. Following the convention, when the phase change layer 40c does not include the amorphous area, the bit data "0" may be regarded as being written to the storage node 40.

A strength of a resistance measured by applying a current that does not change a phase of the phase change layer 40c to the storage node 40 is determined to read out whether bit data written to the storage node 40 is "1" or "0." Thus, the current applied to the storage node 40 during the reading may be lower than the first and second phase change currents I1 and I2, for example, may be 0.1 mA. Alternatively, a low voltage, for example, a voltage of 0.2V, may be applied to the storage node 40.

Figure 6:
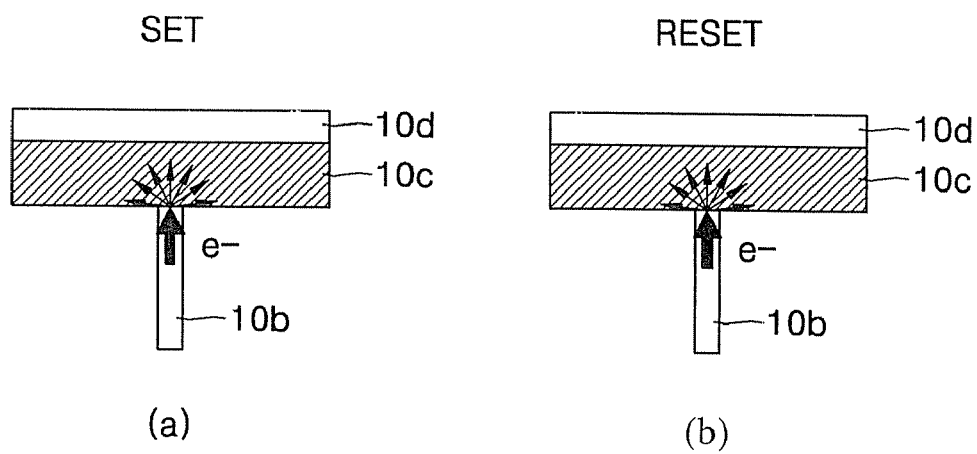
FIGS. 6A and 6B are cross-sectional views of the conventional PRAM illustrating flows of electrons during an operation of the conventional PRAM.
Figure 7:
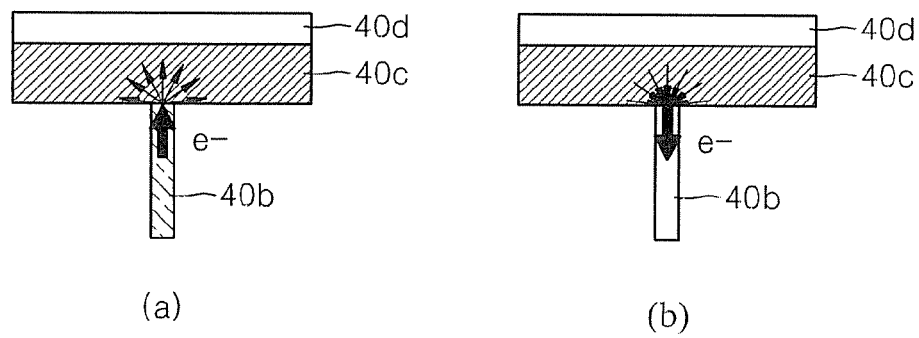
FIGS. 7A and 7B are cross-sectional views illustrating flows of electrons when reset and set currents are applied during an operation of the PRAM according to an embodiment of the present invention.

FIGS. 6A and 6B are cross-sectional views of the conventional PRAM illustrating flows of electrons during an operation of the conventional PRAM, and FIGS. 7A and 7B are cross-sectional views illustrating flows of electrons when reset and set currents are applied during an operation of the PRAM according to an embodiment of the present invention.

For convenience, switching devices are not shown in FIGS. 6A, 6B, 7A, and 7B. FIGS. 6A and 6B show flows of electrons corresponding to set and reset currents, respectively, applied during the operation of the conventional PRAM. The electrons flow in the same direction. FIG. 7A shows a flow of electrons corresponding to a set current, i.e., the second phase change current I2, applied during the operation of the PRAM according to exemplary embodiments of the present invention, and FIG. 7B shows a flow of electrons corresponding to a reset current, i.e., the first phase change current I1, applied during the operation of the PRAM according to exemplary embodiments of the present invention.

In the case of the operation of the conventional PRAM, the electrons flow through the conductive plug 10b toward the phase change layer 10c at all times. In the case of the operation of the PRAM according to exemplary embodiments of the present invention, directions along which the electrons flow may vary with the characteristic of the operation of the PRAM. In other words, in the operation of the PRAM according to these exemplary embodiments, the set current is applied so that the electrons flow from the connector 40b toward the phase change layer 40c. However, the reset current is applied so that the electrons flow from the phase change layer 40c toward the connector 40b. In a case where the electrons flow from the phase change layer 40c toward the connector 40b as shown in FIG. 7B, an upper portion of the connector 40b is a bottleneck, and a density of the electron is high in a predetermined area of the phase change layer 40c around the upper portion of the connector 40b. Thus, although the reset current of these exemplary embodiments can be smaller than the reset current according to the prior art, an amorphous area is formed on the phase change layer 40c.

Figure 8:
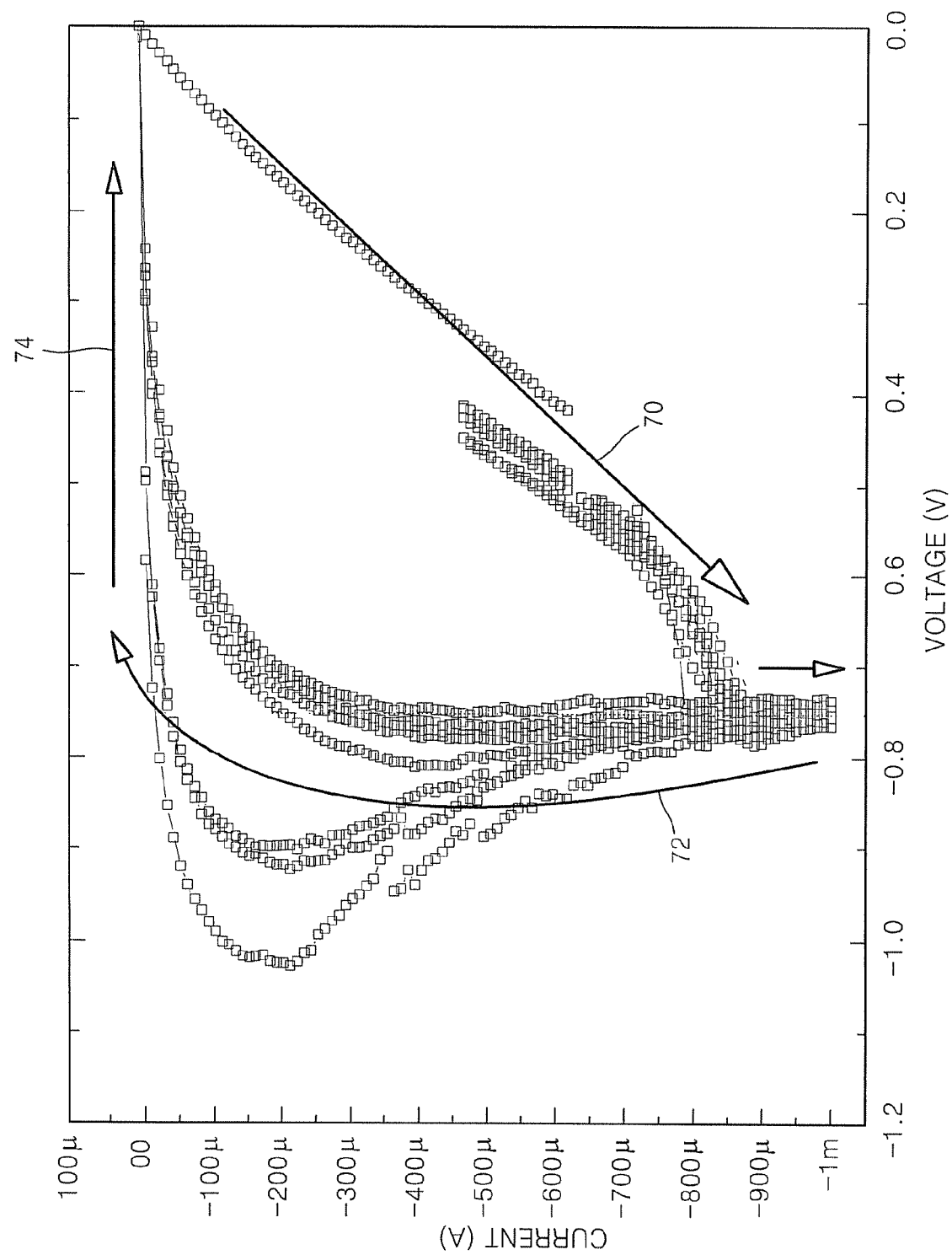
FIG. 8 is a graph illustrating a voltage-current characteristic related to applying of a rest current during the operation of the PRAM according to an embodiment of the present invention.

FIG. 8 is a voltage-current graph illustrating a process of forming an amorphous area on a phase change layer by applying a rest current in an opposite direction along which a set current is applied, according to an embodiment of the present invention. First, second, and third arrows 70, 72, and 74 denote changes of a current with respect to a voltage.

Referring to the first arrow 70 of FIG. 8, the current is increased with the voltage and then about 1 mA when the voltage reaches between −0.7V and −0.8V. This current corresponds to the electron of FIG. 7B flowing from the phase change layer 40c toward the connector 40b. After the current reaches about 1 mA, the current is sharply reduced as marked with the second arrow 72. Thereafter, as marked with the third arrow 74, the current hardly flows. This means that the electron concentrates from the phase change layer 40c toward the connector 40b, a portion of the phase change layer 40c around the connector 40b is changed into an amorphous area, and a resistance of the phase change layer 40c is increased.

Figure 9:
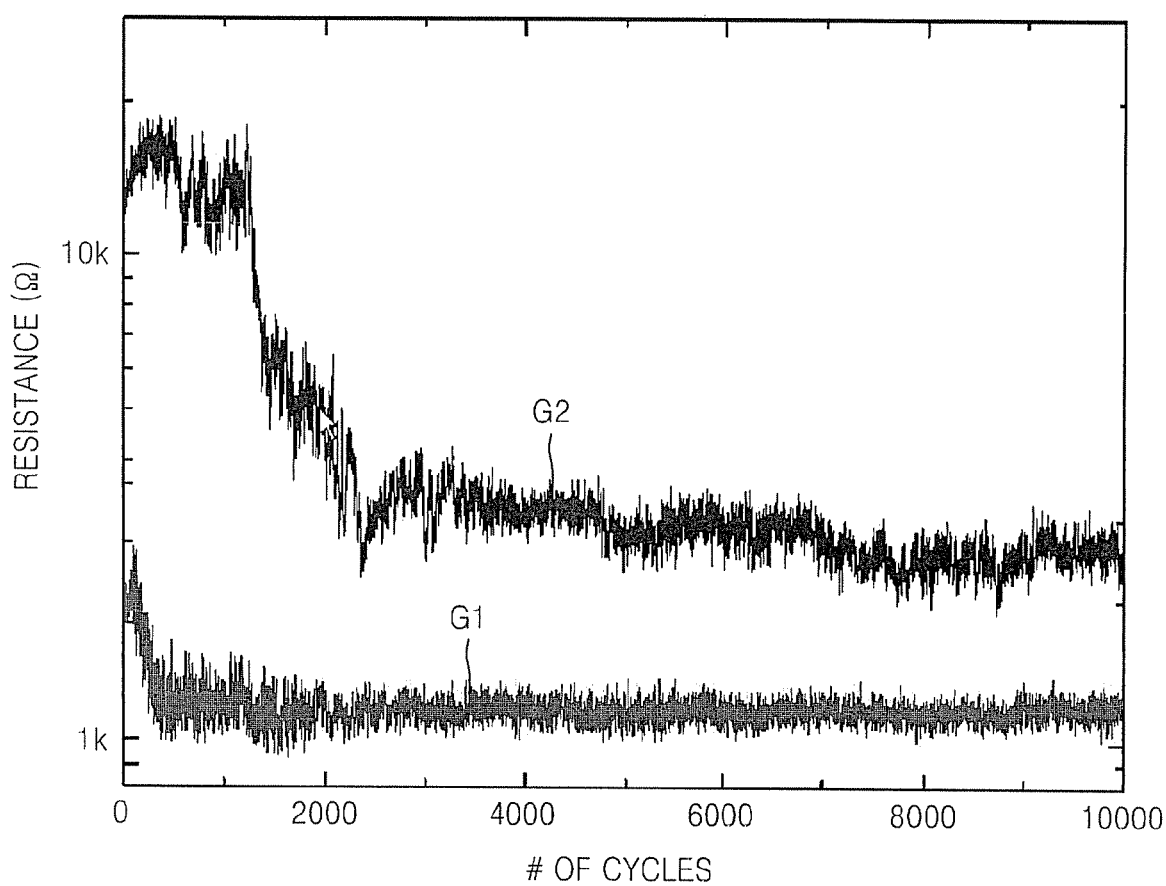
FIG. 9 is a graph illustrating results of an endurance test using the method of operating the PRAM according to an embodiment of the present invention.

FIG. 9 is a graph illustrating results of an endurance test using the method of operating the PRAM according to the present invention.

For the endurance test, a set current of 1 mA was applied, and then a reading current of 0.01 mA was applied to measure a resistance of a phase change layer. Next, a reset current of 1 mA was applied, and then a reading current of 0.01 mA was applied to measure the resistance of the phase change layer. This process was repeated 10,000 times. A first graph G1 shown in FIG. 9 denotes the resistance of the phase change layer measured after the set current is applied, and a second graph G2 shown in FIG. 9 denotes the resistance of the phase change layer after the reset current is applied.

Referring to the first and second graphs G1 and G2 shown in FIG. 9, after the above-described process is repeated 10,000 times, the resistance of the phase change layer measured after the reset current is applied is two times the resistance of the phase change layer measured after the set current is applied.

As described above, in a method of operating a PRAM according to exemplary embodiments of the present invention, set and reset currents can be applied in opposite directions. Here, the reset current can be smaller than 1.6 mA, for example, may be less than or equal to 1 mA. Lowering of the reset current can contribute to reducing a size of a transistor more than when the reset current is 1.6 mA. As a result, an integration of the PRAM can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of operating a phase change random access memory comprising a switching device and a storage node comprising a phase change layer, the method comprising:

applying a reset current passing through the phase change layer from a lower portion of the phase change layer toward an upper portion of the phase change layer and being smaller than 1.6 mA to the storage node to change a portion of the phase change layer into an amorphous state, wherein at least one of reset and set currents are one of direct currents and pulse currents, applying the set current to the storage node in an opposite direction to a direction along which the reset current is applied.

2. The method of claim 1, wherein the reset current is less than or equal to 1 mA.

3. The method of claim 1, wherein the storage node comprises an upper electrode formed on the phase change layer, a lower electrode formed under the phase change layer, and a connector connecting the phase change layer to the lower electrode.

4. The method of claim 3, wherein the connector is a conductive plug.

5. The method of claim 3, wherein the connector is a nanotube.

6. A method of operating a phase change random access memory device comprising a switching device, a lower electrode, a phase change layer, a connector between the lower electrode and the phase change layer to connect the lower electrode and the phase change layer, and an upper electrode formed on the phase change layer, the method comprising:

applying a reset current of less than 1.6 mA from the lower electrode through the connector via the lower electrode into the phase change layer connected to the connector and to the upper electrode from the phase change layer, to cause a change in phase of a portion of the phase change layer into an amorphous state, wherein at least one of reset and set currents are one of direct currents and pulse currents, and applying the set current to the storage node in an opposite direction to a direction along with the reset current is applied.

7. The method of claim 6, wherein the reset current is less than or equal to 1 mA.

8. The method of claim 6, wherein the connector is a conductive plug.

9. The method of claim 6, wherein the connector is a nanotube.

* * * * *